US008421106B2

(12) United States Patent  
Hwang (10) Patent No.: US 8,421,106 B2
(45) Date of Patent: Apr. 16, 2013

(54) LIGHT EMITTING DEVICE, SYSTEM AND PACKAGE

(75) Inventor: Sung Min Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 186 days.

(21) Appl. No.: 12/878,819

(22) Filed: Sep. 9, 2010

(65) Prior Publication Data

US 2011/0057224 A1   Mar. 10, 2011

(30) Foreign Application Priority Data

Sep. 10, 2009   (KR) .................... 10-2009-0085318

(51) Int. Cl.
*H01L 33/00* (2010.01)

(52) U.S. Cl.
USPC ............. 257/98; 257/135; 257/321; 257/332; 257/E33.056

(58) Field of Classification Search ............ 257/98, 257/135, 332, 321, E33.056
See application file for complete search history.

(56) References Cited

U.S. PATENT DOCUMENTS

| | | | | |
|---|---|---|---|---|
| 5,661,091 | A * | 8/1997 | Duinkerken et al. | 438/424 |
| 7,227,226 | B2 * | 6/2007 | Kawamura | 257/332 |
| 2003/0111667 | A1 | 6/2003 | Schubert | |
| 2005/0056855 | A1 | 3/2005 | Lin et al. | |
| 2005/0104081 | A1 | 5/2005 | Kim et al. | |
| 2005/0135448 | A1 * | 6/2005 | Chua et al. | 372/50 |
| 2006/0060880 | A1 | 3/2006 | Lee et al. | |
| 2008/0217635 | A1 | 9/2008 | Emerson et al. | |
| 2008/0224202 | A1 * | 9/2008 | Young et al. | 257/321 |
| 2009/0184334 | A1 | 7/2009 | Lee et al. | |
| 2010/0314642 | A1 | 12/2010 | Kudo et al. | |

FOREIGN PATENT DOCUMENTS

| | | |
|---|---|---|
| CN | 1588652 | 3/2005 |
| CN | 1619845 A | 5/2005 |
| CN | 1770486 | 5/2006 |
| DE | 10 2007 003 282 | 7/2008 |
| EP | 2 224 503 | 9/2010 |
| JP | 2003-142727 | 5/2003 |
| JP | 2008041839 | 2/2008 |
| KR | 2005-302980 | 10/2005 |
| KR | 10-2006-0062715 | 6/2006 |
| KR | 10-2008-0075368 | 8/2008 |
| KR | 2008-205005 | 9/2008 |
| KR | 10-2009-0010623 | 1/2009 |
| KR | 10-2010-0010827 | 2/2010 |
| WO | WO2007/036164 | 4/2007 |
| WO | WO2008/089728 | 7/2008 |

OTHER PUBLICATIONS

Huh, C., et al., Improvement in light-output efficiency of InGaN/GaN multiple-quantum well light-emitting diodes by current blocking layer, Journal of Applied Physics, (Sep. 1, 2002), 92:5:2248-2250.
Korean Office Action dated Dec. 1, 2010.
Korean Office Action dated Mar. 28, 2011.

(Continued)

*Primary Examiner* — Kenneth Parker
*Assistant Examiner* — Dale E Page
(74) *Attorney, Agent, or Firm* — KED & Associates LLP (57) ABSTRACT

A light emitting device includes a light emitting structure formed from an active layer located between two semiconductor layers. An insulator extends through the active layer and at least partially through the semiconductor layers, and the light emitting structure is located between a first electrode and a second electrode layer. The first electrode and insulator overlap one another and may have the same or different widths.

21 Claims, 10 Drawing Sheets

OTHER PUBLICATIONS

Korean Office Action dated Jun. 23, 2011.
European Search Report dated Jul. 13, 2011.
Korean Office Action dated Apr. 2, 2012.
Chinese Office Action dated May 29, 2012.
Chinese Office Action dated Nov. 20, 2012 issued in Application No. 201010280366.0.

* cited by examiner

LIGHT EMITTING DEVICE, SYSTEM AND PACKAGE

CROSS-REFERENCE TO RELATED APPLICATIONS

This application claims priority under 35 USC §119 to Korean Application No. 10-2009-0085318, filed Sep. 10, 2009, incorporated herein by reference.

BACKGROUND

1. Field

One or more embodiments described herein relate emission of light.

2. Background

A light emitting device (LED) converts an electrical signal into light. Because of their size, power efficiency and versatility, LEDs have been found to be suitable for a variety of applications. However, they still have drawbacks.

DETAILED DESCRIPTION

Figure 1:
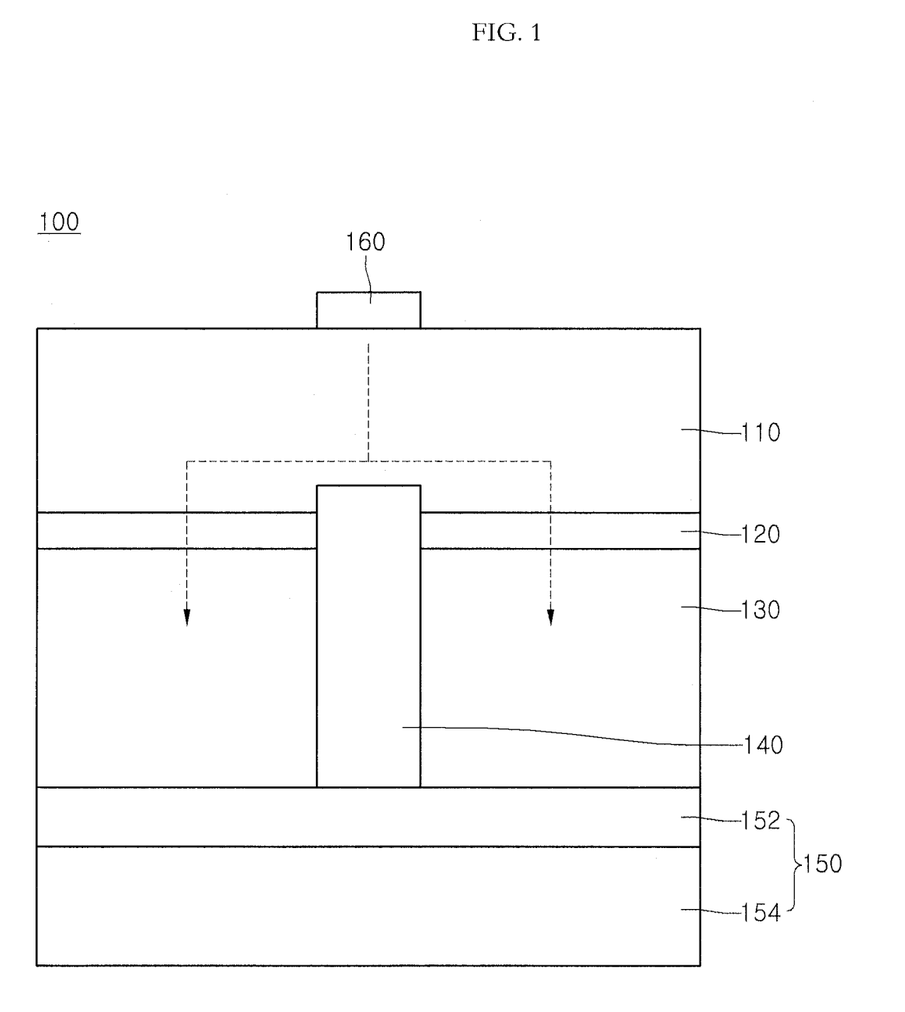
FIG. 1 is a diagram showing one embodiment of a light emitting device.

FIG. 1 shows one embodiment of a light emitting device 100 which includes a light emitting structure having a semiconductor layer 130 of a second conductivity type, an active layer 120, a semiconductor layer 110 of a first conductivity type, and an insulating layer 140 formed on a cavity C (FIG. 3) defined by removing a section of the light emitting structure. The device 100 also includes a second electrode layer 150 over the second conductivity type semiconductor layer 130.

The insulating layer is provided to control the flow of current (e.g., flow rate and/or amount) in the device, to thereby provide an LED that has improved light extraction efficiency. Also, current spreading can be induced to thereby enhance reliability of the LED.

FIGS. 2 to 5 show different stages produced by one embodiment of a method for manufacturing an LED, which, for example, may be the LED shown in FIG. 1.

Figure 2:
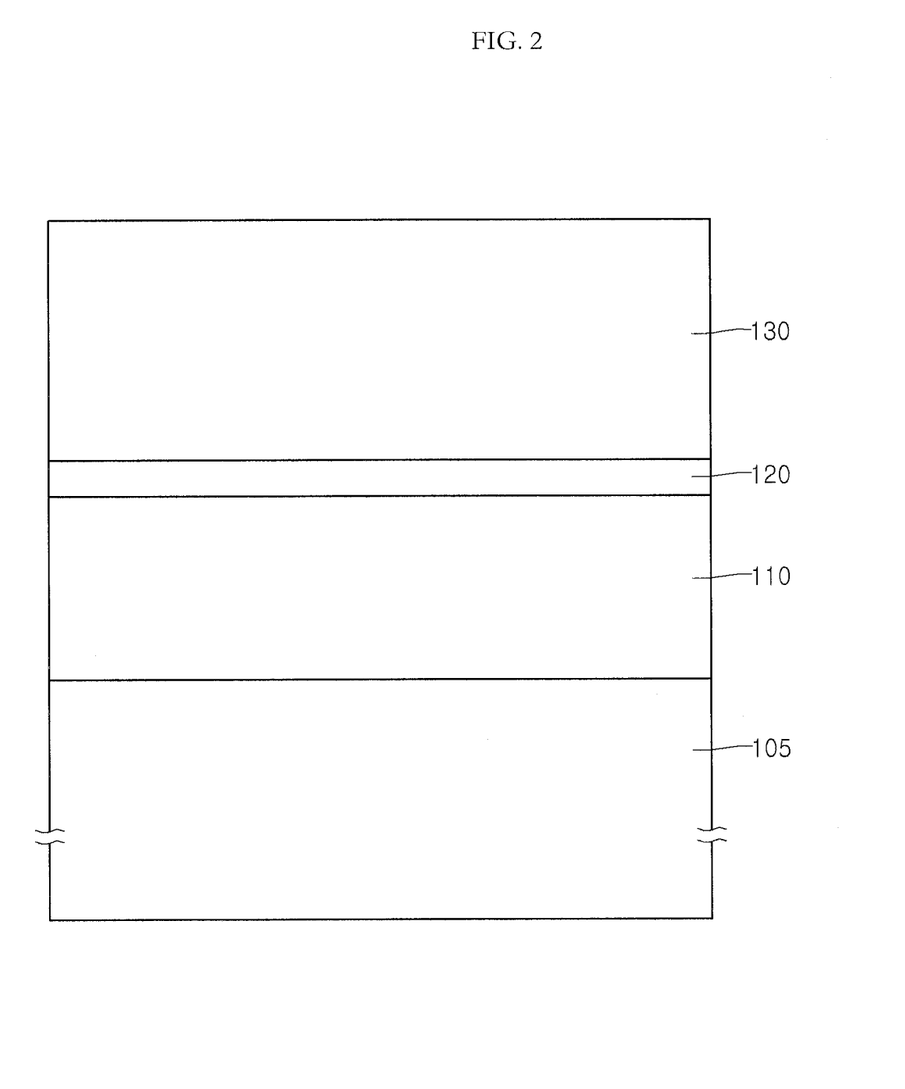
FIGS. 2 to 5 are diagrams showing different stages produced by one embodiment of a method for manufacturing a light emitting device.

First, as shown in FIG. 2, a first substrate 105 is prepared. The first substrate 105 may be or include a conductive substrate or an insulating substrate. For example, the first substrate 105 may be made of a material that includes at least one of sapphire ($Al_2O_3$), SiC, Si, GaAs, GaN, ZnO, Si, GaP, InP, Ge or $Ga_2O_3$. While an irregular structure may be formed in an upper surface of the first substrate 105, the embodiments disclosed herein are not of be limited to such a structure. Wet etching may be performed with respect to the first substrate 105 to remove an impurity of a surface of the first substrate 105.

A buffer layer (not shown) may be formed over the first substrate 105. The buffer layer may buffer a lattice mismatch between the materials constituting the light emitting structure and the first substrate 105. By way of example, the buffer layer may be formed of a Group III-V compound semiconductor such as at least one of GaN, InN, AlN, InGaN, AlGaN, InAlGaN, or AlInN. An undoped semiconductor layer (not shown) may be formed over the buffer layer, but the embodiments described herein are not required to include this undoped layer.

Thereafter, the first conductivity type semiconductor layer 110 is formed over the first substrate 105. The first conductivity type semiconductor layer 110 may be implemented by a Group III-V compound semiconductor doped with a first conductive type dopant. In the case where the first conductivity type semiconductor layer 110 is an N-type semiconductor layer, the first conductivity type dopant is an N-type dopant which may include Si, Ge, Sn, Se, and/or Te as the N-type dopant. A different type of dopant or a different dopant material may be used in other embodiments.

The first conductivity type semiconductor layer 110 may be formed using, for example, a chemical vapor deposition (CVD), a molecular beam epitaxy (MBE), a sputtering, or a hydride vapor phase epitaxy (HVPE). Also, the first conductivity type semiconductor layer 110 may be formed by injecting trimethyl gallium gas (TMGa), ammonia gas ($NH_3$), nitrogen gas ($N_2$), and/or silane gas ($SiH_4$) including an n-type impurity such as silicon (Si).

Moreover, the first conductivity type semiconductor layer 110 may be formed of at least one of GaN, InN, AlN, InGaN, AlGaN, InAlGaN, AlInN, AlGaAs, InGaAs, AlIn GaAs, GaP, AlGaP, InGaP, AlInGaP, or InP.

Next, the active layer 120 is formed over the first conductivity type semiconductor layer 110. The active layer 120 may have a single quantum well structure, a multi quantum well (MQW) structure, a quantum-wire structure, or a quantum dot structure, which may be formed, for example, by alternately stacking thin nitride semiconductor layers having different energy bands at one time or several times.

According to one non-limiting embodiment, the active layer 120 may be formed in a MQW structure that includes an InGaN well layer/InGaN barrier layer formed by injecting trimethyl gallium gas (TMGa), ammonia gas ($NH_3$), nitrogen gas ($N_2$), and/or trimethyl indium gas (TMIn) gas. A different process may be used in other embodiments. At this time, the energy band gap of the well layer may be smaller than that of the barrier layer.

The well layer/barrier layer of the active layer 120 may be formed in at least one pair structure of InGaN/GaN, InGaN/InGaN, AlGaN/GaN, InAlGaN/GaN, GaAs/AlGaAs(InGaAs), GaP/AlGaP(InGaP). Different structures may be used in other embodiments. The well layer may be formed of a material having a band gap lower than a band gap of the barrier layer.

A conductive clad layer may be formed over or/and below the active layer 120. The conductive clad layer may be formed, for example, of an AlGaN-based semiconductor and may have a band gap higher than the active layer 120.

Thereafter, the second conductivity type semiconductor layer 130 is formed over the active layer 120 and may include a Group III-V compound semiconductor, e.g., semiconductor material having a compositional formula of $In_xAl_yGa_{1-x-y}N$ ($0 \leq x \leq 1, 0 \leq y \leq 1, 0 \leq x+y \leq 1$). The second conductivity type semiconductor layer 130 may be formed of, for example, at least one of GaN, AlN, AlGaN, InGaN, InN, InAlGaN, AlInN, AlGaAs, GaP, GaAs, GaAsP, or AlGaInP.

In the case where the second conductivity type semiconductor layer 130 is a P-type semiconductor layer, the second conductivity type dopant may include Mg, Zn, Ca, Sr, or Ba as a P-type dopant. The second conductivity type semiconductor layer 130 may be formed in a single layer structure or a multi-layer structure.

For example, the second conductivity type semiconductor layer 130 may be a P-type GaN layer, formed by injecting trimethyl gallium gas (TMGa), ammonia gas ($NH_3$), nitrogen gas ($N_2$) gas, and/or biscetyl cyclo pentadienyl magnesium (($EtCp_2Mg$){$Mg(C_2H_5C_5H_4)_2$}) including a P-type impurity such as Mg into a chamber.

In accordance with one embodiment, the first conductivity type semiconductor layer 110 may be implemented by an N-type semiconductor layer and the second conductivity type semiconductor layer 130 may be implemented by a P-type semiconductor layer. Alternatively, a semiconductor layer having an opposite conductivity type to the second conductivity type, e.g., an N-type semiconductor layer (not shown) may be formed over the second semiconductor layer 130. Accordingly, the light emitting structure may be implemented to include at least one of an N—P junction structure, a P—N junction structure, an N—P—N junction structure, or a P—N—P junction structure.

Figure 3:
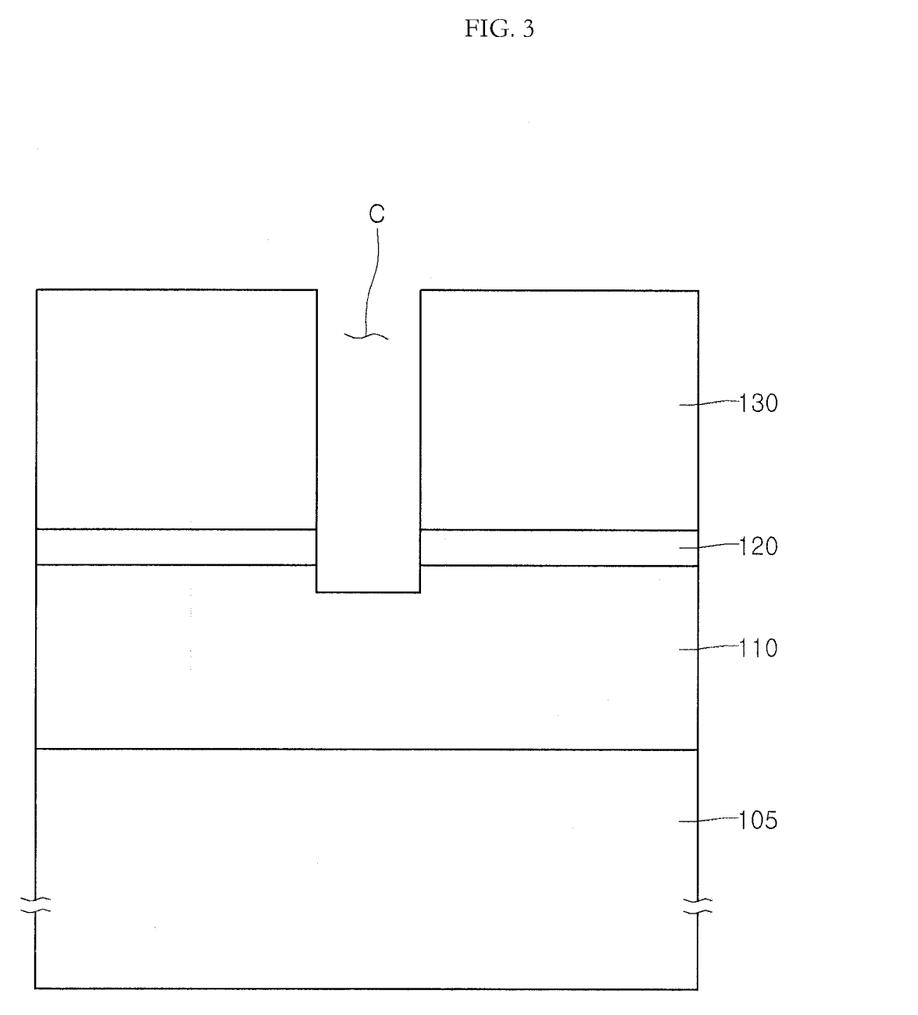

Next, as shown in FIG. 3, the second conductivity type semiconductor layer 130, the active layer 120, and the first conductivity type semiconductor layer 110 are partially removed to form cavity C, which, for example, may be any one of a recess, groove, ditch, trench, hole, or other type of indentation.

To form cavity C, dry or wet etching may be performed starting from a location on the second conductivity type semiconductor layer 130 (positioned vertically below a first electrode 160 to be formed later) until the first conductivity type semiconductor layer 110 is exposed. A different process may be used in other embodiments.

In one example, cavity C may be formed by partially and sequentially etching the second conductivity type semiconductor layer 130 and active layer 120, or by further etching a portion of the first conductivity type semiconductor layer 110. Because the cavity region C (positioned vertically below the first electrode 160) does not have the active layer 120, generation of light due to recombination of carriers (electron and hole) does not occur. That is, because current is not smoothly supplied to the cavity forming region, light emitting is not generated over the cavity C and thus absorption of light by the first electrode 160 positioned over the cavity can be reduced or eliminated.

Figure 6:
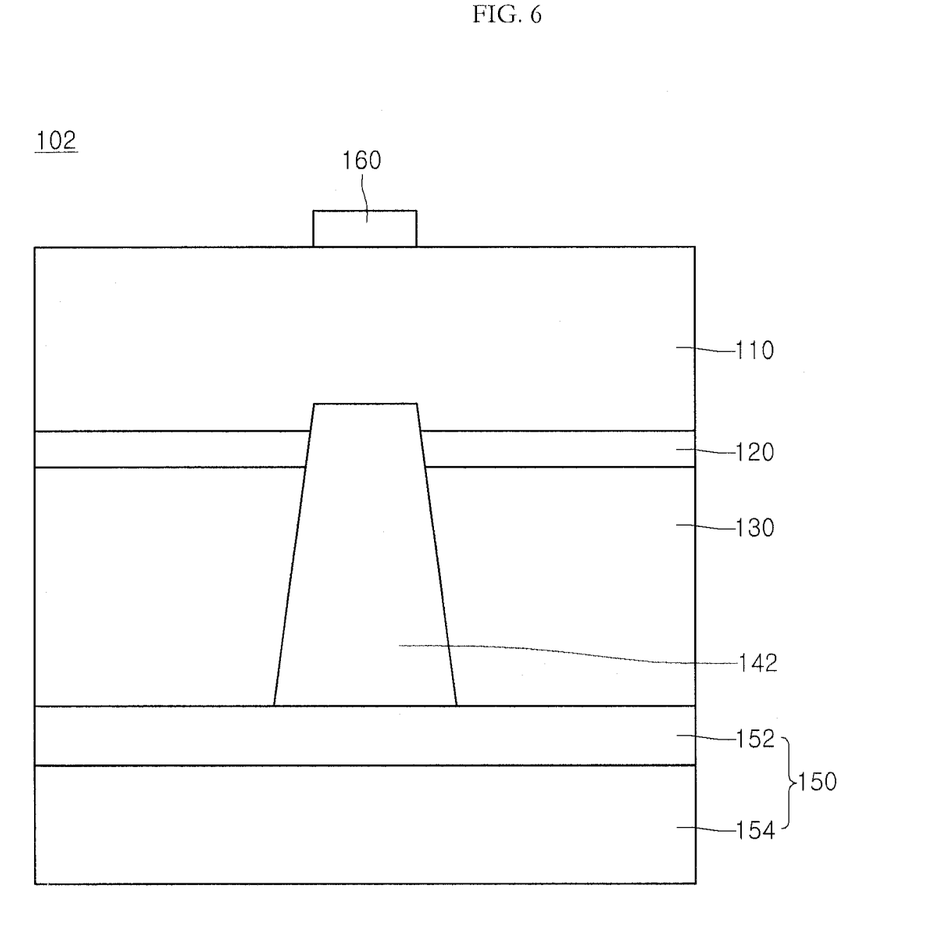
FIG. 6 is a diagram of one embodiment of a light emitting device package.

In a light emitting device 102 according to another embodiment shown in FIG. 6, an upper width of the cavity may be different from a lower width thereof. For example, by performing etching based on the crystal direction of the light emitting device, the cavity may be formed to have a slope or to be tapered. Therefore, light is emitted from the active layer but not absorbed by insulating layer 142 may be reflected and externally extracted.

Figure 4:
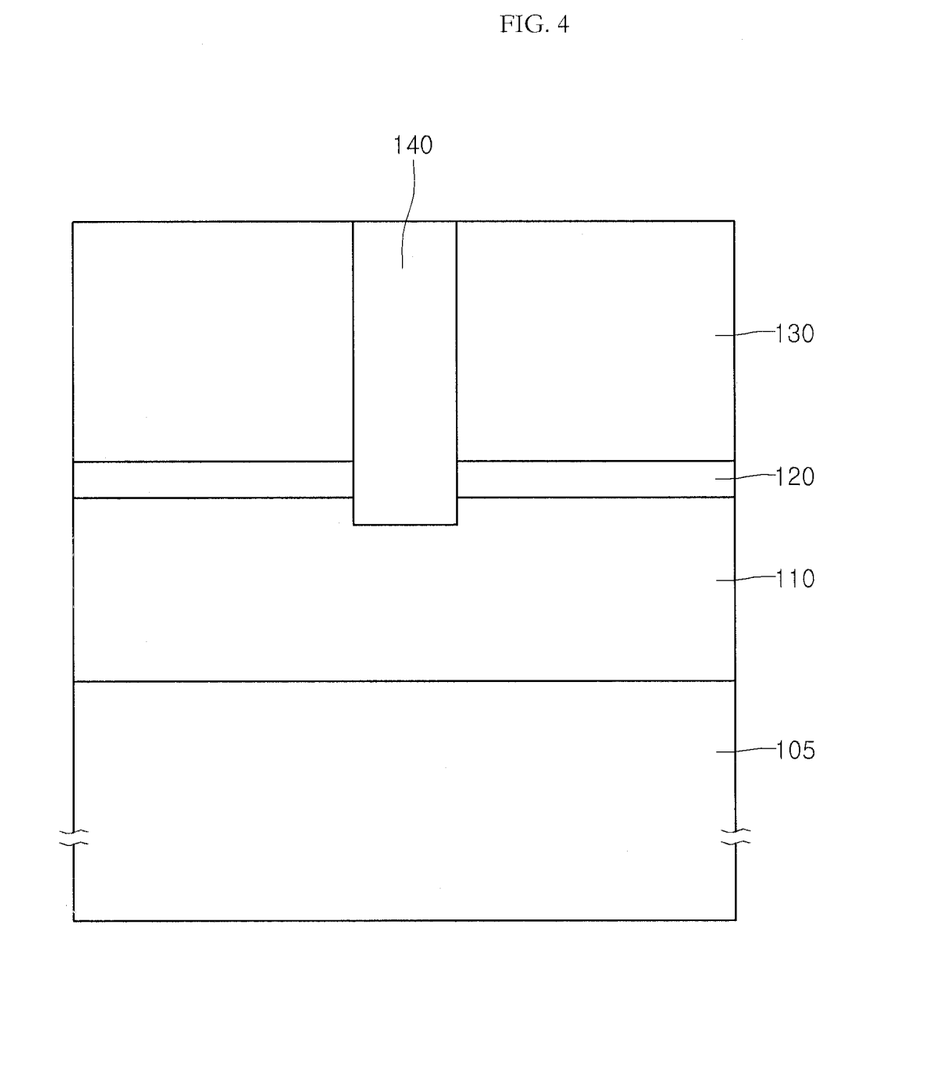

Next, as shown in FIG. 4, the insulating layer 140 is formed over the cavity C. The insulating layer 140 may include, for example, a dielectric layer such as a nitride layer (e.g., SiN) or an oxide layer (e.g., $SiO_2$). In one embodiment, the insulating layer 140 may have a reflectivity of 50% by itself or may have a 50% or more reflectivity due to a difference in the refractive index between the semiconductor layer and the insulating layer. Therefore, light emitted from the active layer is less absorbed by the insulating layer 140, so that light extraction efficiency can be enhanced.

Thereafter, a second electrode layer 150 is formed over the second conductivity type semiconductor layer 130 and the insulating layer 140.

The second electrode layer 150 may include an ohmic layer (not shown), a reflective layer 152, a junction layer (not shown), or a conductive supporting substrate 154. The second electrode layer 150 may be formed of at least one of titanium (Ti), chromium (Cr), nickel (Ni), aluminum (Al), platinum (Pt), gold (Au), tungsten (W) or a semiconductor substrate doped with an impurity. For example, the second electrode layer 120 may include an ohmic layer formed by multi-stacking a single metal layer, a metal alloy layer, and/or a metal oxide layer.

The ohmic layer may be formed, for example, to include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, or Hf.

The second electrode layer 150 may include reflective layer 152 and/or a junction layer. The reflective layer 152 may be formed, for example, of a metal or metal alloy that includes at least one of Ag, Ni, Al, Rh, Pd, Ir, Ru, Mg, Zn, Pt, Au, or Hf. Also, the reflective layer 152 may be formed in a multi-layer structure using the foregoing metal or alloy and a transparent conductive material such as IZO, IZTO, IAZO, IGZO, IGTO, AZO, or ATO, or a multi-layer structure of IZO/Ni, AZO/Ag, IZO/Ag/Ni, AZO/Ag/Ni.

Because light emitted from the active layer is reflected by the reflective layer 152 of the second electrode layer 150, light extraction efficiency can be enhanced. Also, in the case where the width of cavity C increases as it goes from the upper side to the lower side as shown in FIG. 6, the light generated from the active layer and the light reflected by the reflective layer are efficiently reflected in an upward direction of the light emitting device by a second insulating layer 142 and thus the light extraction efficiency can be increased.

Also, in the case where the second electrode layer 120 includes the junction layer (not shown), the reflective layer 152 may function as the junction layer or may include a barrier metal or bonding metal. For example, the junction layer may include at least one of Ti, Au, Sn, Ni, Cr, Ga, In, Bi, Cu, Ag, or Ta.

Figure 5:
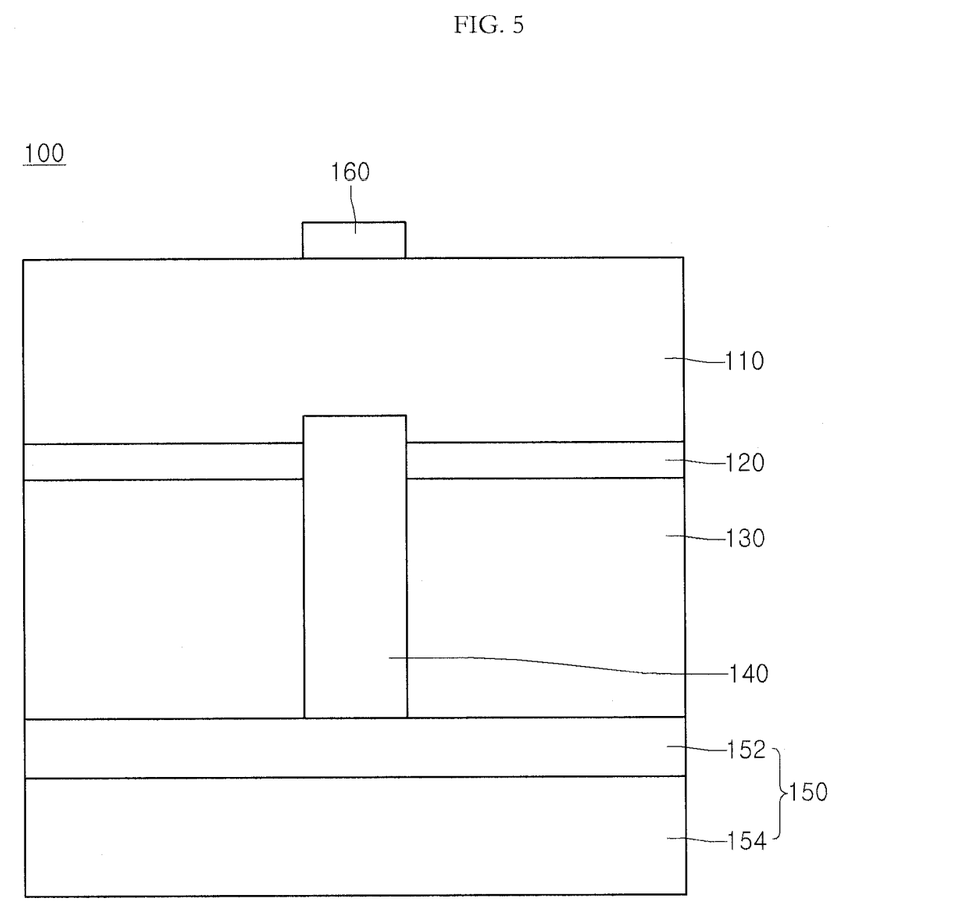

While FIG. 5 shows that the insulating layer 140 completely fills cavity C, in other embodiments the material of the insulating layer 140 may only partial fill the cavity or may overflow the cavity.

Figure 7:
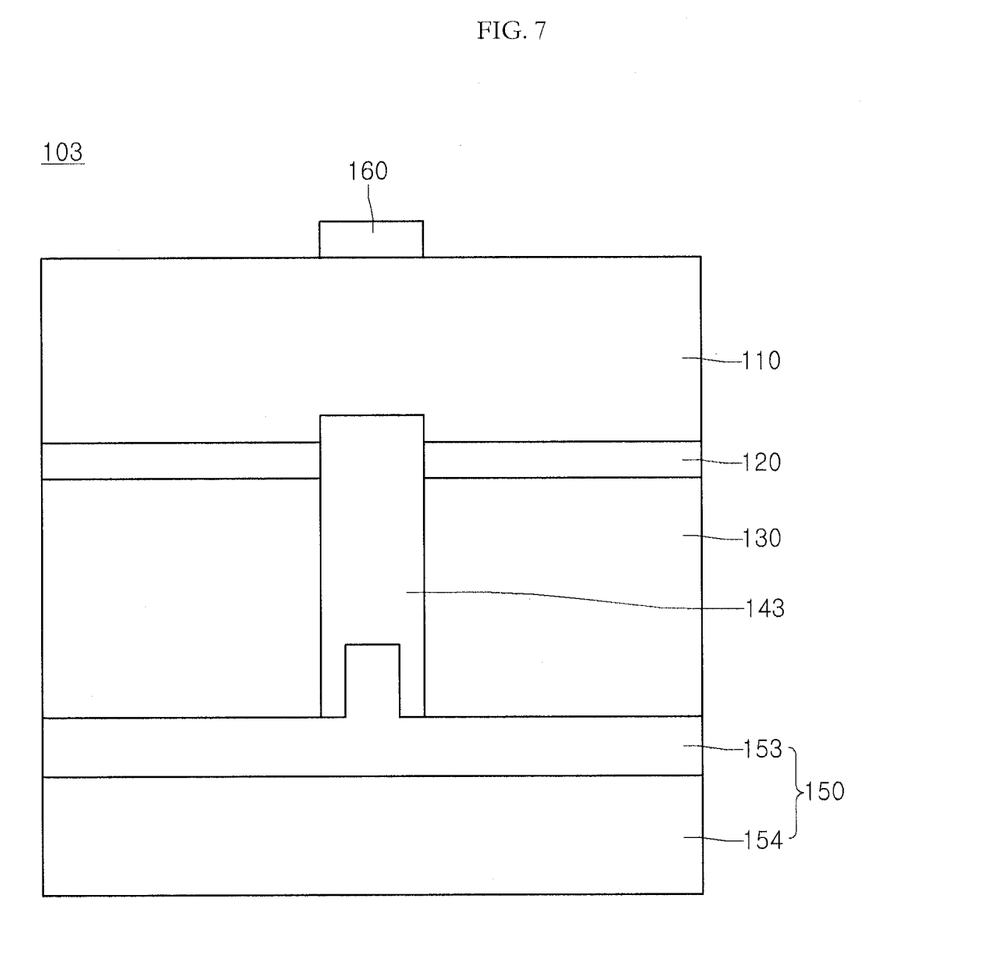
FIG. 7 is a diagram of another embodiment of a light emitting device package.

For example, in a light emitting device 103 according to another embodiment shown in FIG. 7, an insulating layer 143 may be formed in a structure that partially fills (e.g., project into) cavity C. By doing so, a second reflective layer 153 can partially exist in the cavity C and thus can reflect light to enhance the light extraction efficiency.

Thereafter, as shown in FIG. 5, the conductive supporting substrate 154 may be formed over the reflective layer 152. The conductive supporting substrate 154 may be formed, for example, of a metal, a metal alloy, or a conductive semiconductor material that has superior electrical conductivity such that holes may be efficiently injected. In one embodiment, the conductive supporting substrate 154 may include at least one of copper (Cu), Cu alloy, gold (Au), nickel (Ni), molybdenum (Mo), Cu—W, or a carrier wafer (e.g., Si, Ge, GaAs, GaN, ZnO, SiGe, SiC). The thickness of the conductive supporting substrate 154 may vary with the design of the light emitting device 100. In one illustrative application, thickness may lie in a range of 30 μm to 500 μm.

The conductive supporting substrate 154 may be formed, for example, using any one of an electrochemical metal deposition method, a plating method, or a bonding method using a eutectic metal.

Next, as shown in FIG. 5, the first substrate 105 may be removed using, for example, a laser lift off method using a high power laser, a chemical lift off method, by physically grinding the first substrate 105.

Thereafter, a first electrode 160 may be formed over the first conductivity type semiconductor layer 110 exposed by removing the first substrate 105. The first electrode 160 may be formed over the first conductivity type semiconductor layer 110 so as to spatially overlap the cavity C.

Because the cavity region positioned vertically below the first electrode 160 does not have active layer 120, generation of light due to recombination of carriers (i.e., electron and hole) does not occur.

Also, because cavity C is an etched region is covered with the insulating layer 140, current does not flow through the cavity C but is diffused into regions other than the cavity. That is, because the cavity is covered or filled with insulating layer 140, the cavity functions as a current blocking layer (CBL). In accordance with this and other embodiments described herein, efficient current flow may be generated so that the reliability can be enhanced and absorption of light by the first electrode can be minimized, thereby increasing light quantity.

Also, by forming a reflection slope in the second insulating layer or by providing a reflective layer in a third insulating layer, according to one or more embodiments light extraction efficiency can be increased to thereby increase light output power. Also, in accordance with one or more embodiments, light extraction efficiency and current spreading efficiency can be enhanced together.

Figure 8:
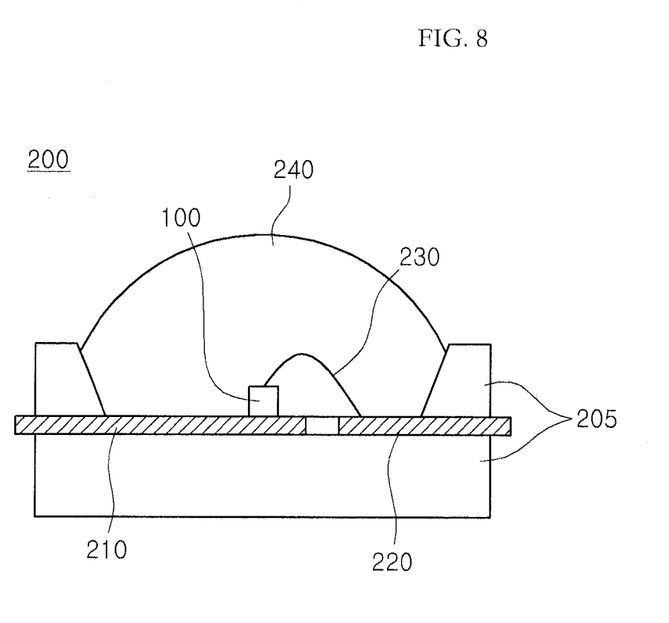
FIG. 8 is a diagram of an embodiment of a light emitting device package.

FIG. 8 shows one embodiment of a light emitting device package 200 that may include any of the embodiments of the light emitting device described herein. Referring to FIG. 8, the light emitting device package includes a body 205, third and fourth electrode layers 210 and 220 mounted over the body 205, an light emitting device 100 mounted over the body 205 and electrically connected to the third and fourth electrode layers 210 and 220, and a molding member 240 enclosing the light emitting device 100.

The body 205 may be formed to include a silicon, synthetic resin, or metal material and may have an inclined surface around the light emitting device 100.

The third electrode layer 210 and the fourth electrode layer 220 are electrically separated from each other and function to supply electric power to the light emitting device. Also, the third and fourth electrode layers may reflect light generated from the light emitting device to thereby increase light efficiency and may emit heat from the light emitting device.

The light emitting device 100 may be a vertical-type light emitting device as shown in FIG. 1 or another type of device. Also, the light emitting device 102 shown in FIG. 6 and the light emitting device 103 shown in FIG. 7 may be applied to the light emitting device package.

The light emitting device 100 may be mounted over the body 205 or over the third electrode layer 210 or the fourth electrode layer 220.

The light emitting device 100 may be electrically connected to the third electrode layer 210 and/or the fourth electrode layer 220 through a wire 230. Also, while FIG. 8 illustratively shows that the vertical-type light emitting device 100 uses single wire 230, a different number of wires may be used in other embodiments.

The molding member 240 may enclose and protect the light emitting device 100. Also, a fluorescent material may be included in the molding member 240 to change the wavelength of light emitted from the light emitting device 100.

The light emitting device package may be applied to a lighting system such as one that includes a lighting unit as shown in FIG. 14, a backlight unit shown in FIG. 15, a signal light, a vehicle headlight, a sign, or any one of a number of other systems or devices that required a light-emission element.

Figure 9:
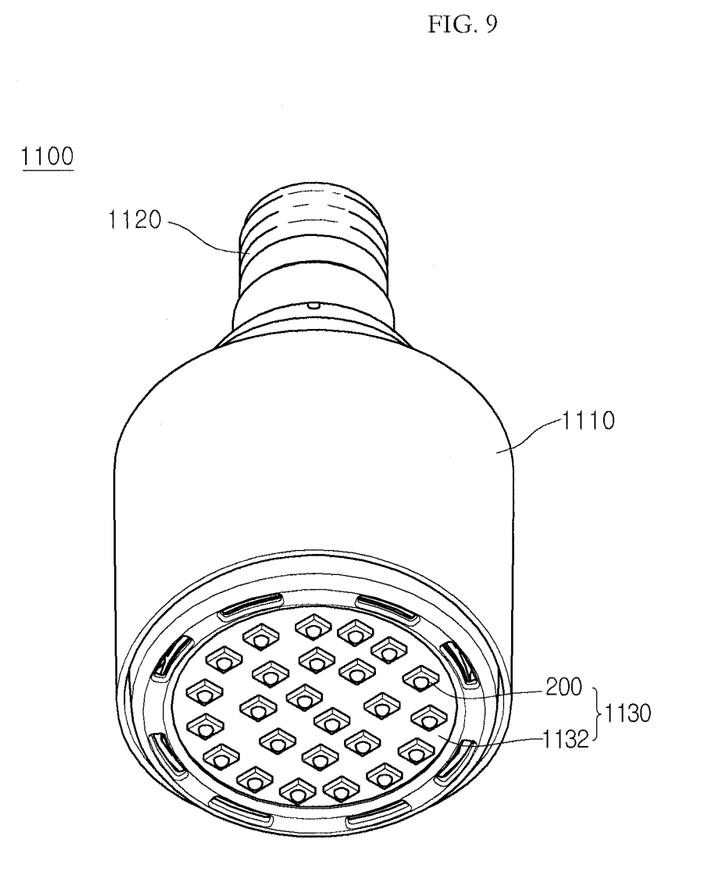
FIG. 9 is a diagram showing an embodiment of lighting unit.

FIG. 9 shows an embodiment of a lighting unit 1100 which is an example of one such lighting system. Referring to FIG. 9, the lighting unit 1100 includes a case body 1110, a light emitting module part 1130 equipped in the case body 1110, and a connection terminal 1120 equipped in the case body 1110 and supplied with an electric power from an external power supply.

The case body 110 may be formed of a material having good heat shielding characteristics, for example, a metal material or a resin material.

The light emitting module part 1130 may include a substrate 1132 and at least one light emitting device package 200 mounted on the substrate 1132. The substrate 1132 may be an insulator substrate over which a circuit pattern is printed and, for example, may include a general printed circuit board (PCB), metal core PCB, flexible PCB, or ceramic PCB.

The substrate 1132 may be formed of a material to efficiently reflect light, and a surface thereof may be formed in a color capable of efficiently reflecting light, for example, white or silver color.

One or more light emitting device packages 200 may be mounted over the substrate 1132, and each package 200 may include at least one LED 100. The light emitting diode 100 may be a color LED emitting red, green, blue or white light or a UV LED emitting ultraviolet (UV).

The light emitting module part 1130 may be disposed with combinations of various light emitting device packages in order to obtain a desired color and/or luminance. For example, the light emitting module part 1130 may be disposed with a combination of white, red, and green LEDs to obtain a high color rendering index (CRI).

The connection terminal 1120 may be electrically connected to the light emitting module part 1130 to supply electric power. As shown in FIG. 9, the connection terminal 1120 may be screwed and coupled to an external power in a socket type. A different coupling arrangement may be used in other embodiments. For example, the connection terminal 1120 may be a pin-type inserted into an external power connector part or may be connected to external power through a power line.

Figure 10:
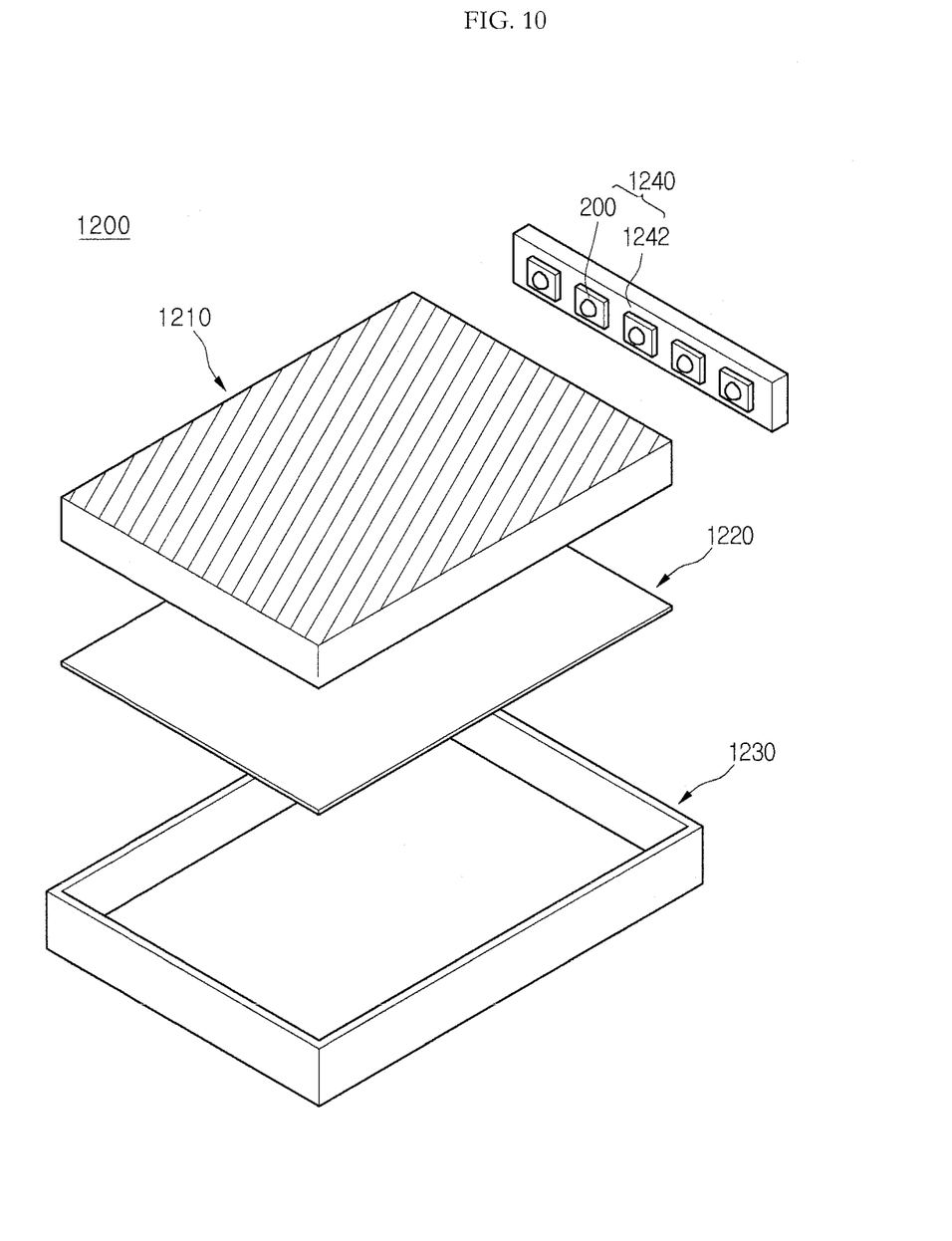
FIG. 10 is a diagram showing an embodiment of a backlight unit.

FIG. 10 shows one embodiment of a backlight unit 1200 that includes a light guide panel 1210, a light emitting module part 1240 supplying light to the light guide panel 1210, a reflective member 1220 below the light guide panel 1210, and a bottom cover 1230 receiving the light guide panel 1210, the light emitting module part 1240, and the reflective member 1220.

The light guide panel 1210 functions to transform linear light to planar light by diffusing the linear light. The light guide panel may include, for example, one of acryl-series resin such as polymethyl metaacrylate (PMMA), polyethylene terephthlate (PET), poly carbonate (PC), COC, or polyethylene naphthalate resin.

The light emitting module part 1240 provides light to at least one side surface of the light guide panel 1210 and ultimately acts as a light source of a display device in which the backlight unit is equipped. The light emitting module part 1240 may contact the light guide panel 1210. More specifically, the light emitting module part 1240 may include a substrate 1242 and a plurality of light emitting device packages 200 mounted on the substrate 1242, and the substrate 1242 may contact the light guide panel 1210.

The substrate 1242 may be a PCB including a circuit pattern (not shown). The substrate 1242 may include a metal core PCB (MCPCB), flexible PCB (FPCB), or another type of PCB including but not limited to a general PCB.

The plurality of light emitting device packages 200 may be mounted over the substrate 1242 such that light emitting surfaces of the plurality of light emitting device packages 200 are spaced apart by a predetermined distance from the light guide panel 1210.

The reflective member 1220 may be provided below the light guide panel 1210. The reflective member 1220 reflects light incident from a bottom surface of the light guide panel to allow the reflected light to be directed toward an upper direction, thereby capable of enhancing brightness of the backlight unit. The reflective member 1220 may be formed, for example, of PET, PC, or PVC resin.

The bottom cover 1230 may receive the light guide panel 1210, light emitting module part 1240, and reflective member 1220. For this purpose, the bottom cover 1230 may be formed in a box shape having an open top surface. In other embodiments, the box cover may have a different shape. Also, the bottom cover 1230 may be formed of a metal or resin material and may be manufactured using a process such as press or injection molding.

The embodiments described herein provide a light emitting device, a light emitting device package, and a lighting system that can enhance light extraction efficiency as well as current spreading efficiency.

In one embodiment, a light emitting device comprises a light emitting structure including a second conductive type semiconductor layer, a first conductive type semiconductor layer, and an active layer between the second conductive type semiconductor layer and the first conductive type semiconductor layer; a first electrode over the first conductive type semiconductor layer; an insulating layer over a cavity defined by partially removing the light emitting structure; and a second electrode layer over the second conductive type semiconductor layer, wherein the insulating layer at least partially and spatially overlaps the first electrode and the second electrode layer over and below the insulating layer.

In another embodiment, a light emitting device comprises a light emitting structure including a first semiconductor layer, an active layer, and a second semiconductor layer each formed in a first direction, and an active layer provided between the second semiconductor layer and the first semiconductor layer; a first electrode adjacent the first semiconductor layer and having a first prescribed width; an insulator extending, in a second direction, from the second semiconductor layer through the active layer to the first semiconductor layer and having a second prescribed width; and a second electrode including a layer adjacent the second semiconductor layer. The second electrode layer has a third prescribed width greater than the first and second prescribed widths, and the first electrode and the insulator overlap each other in the second direction different from the first direction.

The first and second widths may be substantially equal and the first electrode and the insulator are aligned in the second direction. Also, the second electrode layer may overlap the first electrode and the insulator in the second direction.

The second electrode layer may include an electrode portion which extends into a cavity into which the insulator extends, with the cavity formed in the second direction, and the insulator may contact the second semiconductor layer. The insulator may partially extend into the first semiconductor layer in the second direction.

All surfaces of the insulator where the insulator may extend into the first semiconductor layer contacts the first semiconductor layer, and/or all surface interfaces including a surface interface between the insulator and the first semiconductor layer may be in direct contact with each other.

In addition, the insulator may extend into a recess formed in the first semiconductor layer and the insulator may contact all surfaces of the recess.

Also, the insulator may extend into a cavity that passes through the active layer and at least partially through the first and second semiconductor layers. The cavity may have a substantially constant width that corresponds to the second prescribed width of the insulator, or the cavity may have a tapered width which corresponds to tapered sides of the insulator. In this latter case, the surfaces of the cavity and insulator adjacent the second electrode layer may be wider than surfaces of the cavity and insulator that extend into the first semiconductor layer.

In addition, the device may include a reflective layer adjacent the insulating layer and second semiconductor layer, and a conductive supporting substrate adjacent the reflective layer.

The insulator may ser to reduce or block flow of current in the second direction, and/or a flow of current through the insulator is less than a flow of current through the second semiconductor layer. The first direction may be horizontal and the second direction may be vertical.

Also, the third prescribed width may be greater than the second prescribed width which is greater than the first prescribed width.

In another embodiment, a light emitting device package comprises a light emitting device as described above, a package body over which the light emitting device is disposed; and at least one electrode layer electrically connecting the light emitting device and the package body.

In another embodiment, a lighting system comprising light emitting device package as described above.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present.

Any reference in this specification to 'one embodiment,' 'an embodiment,' 'example embodiment,' etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of any one embodiment may be combined with the features of the remaining embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure including a first semiconductor layer, an active layer, and a second semiconductor layer each formed in a first direction, the active layer provided between the second semiconductor layer and the first semiconductor layer;
    a first electrode adjacent the first semiconductor layer and having a first prescribed width;
    an insulator extending, in a second direction, from the second semiconductor layer through the active layer to the first semiconductor layer and having a second prescribed width; and
    a second electrode including a layer adjacent the second semiconductor layer, wherein the second electrode layer has a third prescribed width greater than the first and second prescribed widths, wherein the first electrode and the insulator overlap each other in the second direction different from the first direction, and wherein the first semiconductor layer comprises a top portion between a top surface of the insulator and the first electrode.

2. The light emitting device of claim 1, wherein the first and second widths are substantially equal and wherein the first electrode and the insulator are aligned in the second direction.

3. The light emitting device of claim 1, wherein the second electrode layer overlaps the first electrode and the insulator in the second direction.

4. The light emitting device of claim 1, wherein the second electrode layer includes an electrode portion which extends into a cavity into which the insulator extends, the cavity formed in the second direction.

5. The light emitting device of claim 1, wherein insulator partially extends into the first semiconductor layer in the second direction.

6. The light emitting device of claim 1, wherein all surfaces of the insulator where the insulator extends into the first semiconductor layer contacts the first semiconductor layer.

7. The light emitting device of claim 1, wherein the insulator extends into a recess formed in the first semiconductor layer and wherein the insulator contacts all surfaces of the recess.

8. The light emitting device of claim 1, wherein: the insulator extends into a cavity that passes through the active layer and at least partially through the first and second semiconductor layers.

9. The light emitting device of claim 8, wherein the cavity has a substantially constant width that corresponds to the second prescribed width of the insulator.

10. The light emitting device of claim 8, wherein the cavity has a tapered width which corresponds to tapered sides of the insulator.

11. The light emitting device of claim 10, wherein surfaces of the cavity and insulator adjacent the second electrode layer is wider than surfaces of the cavity and insulator that extend into the first semiconductor layer.

12. The light emitting device of claim 1, further comprising:
    a reflective layer adjacent the insulating layer and second semiconductor layer, and
    a conductive supporting substrate adjacent the reflective layer.

13. The light emitting device of claim 1, wherein a flow of current through the insulator is less than a flow of current through the second semiconductor layer.

14. The light emitting device of claim 1, wherein the first direction is horizontal and the second direction is vertical.

15. The light emitting device of claim 1, wherein the third prescribed width is greater than the second prescribed width which is greater than the first prescribed width.

16. A light emitting device package comprising:
    a light emitting device as recited in claim 1;
    a package body over which the light emitting device is disposed; and
    at least one electrode layer electrically connecting the light emitting device and the package body.

17. A lighting system comprising light emitting device package as in claim 16.

18. The light emitting device of claim 1, wherein the first semiconductor layer comprises a first portion at a first side of the insulator and a second portion at a second side of the insulator, and wherein the first portion is physically connected to the second portion.

19. The light emitting device of claim 18, wherein the first and second sides are opposing sides relative to the insulator.

20. The light emitting device of claim 1, wherein the second electrode layer includes an electrode portion which extends into a cavity into which the insulator extends, and wherein the cavity is formed in the second direction and the electrode portion fills the cavity.

21. The light emitting device of claim 19, wherein:
    the second electrode comprises a reflective layer adjacent the insulating layer and second semiconductor layer, and
        a conductive substrate adjacent the reflective layer,
    a portion of the reflective layer extends into the cavity, and
    the conductive substrate does not extend into the cavity.

* * * * *